United States Patent
Shibata (10) Patent No.: US 10,601,572 B2
(45) Date of Patent: Mar. 24, 2020

(54) IMAGE PROCESSING APPARATUS WITH AN IMPROVED IMAGE DISTORTION CONTROL

(71) Applicant: KYOCERA Document Solutions Inc., Osaka (JP)

(72) Inventor: Yukio Shibata, Osaka (JP)

(73) Assignee: Kyocera Document Solutions, Inc. (JP)

(*) Notice: Subject to any disclaimer, the term of this patent is extended or adjusted under 35 U.S.C. 154(b) by 0 days.

(21) Appl. No.: 16/214,983

(22) Filed: Dec. 10, 2018

(65) Prior Publication Data

US 2019/0199506 A1    Jun. 27, 2019

(30) Foreign Application Priority Data

Dec. 25, 2017   (JP) ................. 2017-248467

(51) Int. Cl.
| | |
|---|---|
| H04N 1/407 | (2006.01) |
| H04L 7/00 | (2006.01) |
| H04L 7/08 | (2006.01) |
| H04L 7/027 | (2006.01) |
| H04N 1/32 | (2006.01) |
| H04N 1/00 | (2006.01) |

(Continued)

(52) U.S. Cl.
CPC ......... *H04L 7/0066* (2013.01); *H03K 5/1252* (2013.01); *H04L 7/027* (2013.01); *H04L 7/08* (2013.01); *H04N 1/00013* (2013.01); *H04N 1/00037* (2013.01); *H04N 1/21* (2013.01); *H04N 1/32* (2013.01)

(58) Field of Classification Search
None
See application file for complete search history.

(56) References Cited

U.S. PATENT DOCUMENTS

| | | | | |
|---|---|---|---|---|
| 7,791,634 B2 * | 9/2010 | Masui | ................. | G02B 26/127 347/249 |
| 8,493,578 B2 * | 7/2013 | Masui | ................. | G03G 15/043 345/213 |

(Continued)

FOREIGN PATENT DOCUMENTS

| | | |
|---|---|---|
| JP | 2012-056161 | 3/2012 |
| JP | 2015-012400 | 1/2015 |
| JP | 2015012400 A * | 1/2015 |

*Primary Examiner* — Dung D Tran (57) ABSTRACT

A receiver circuit receives a transmission signal using serial communication, the transmission signal including image data and a synchronization signal that has a pulse period fluctuated in a predetermined fluctuation range. A data reception processing unit extracts the image data and the synchronization signal from the received transmission signal, and writes each line of the image data into a line memory among line memories while selecting the line memory line by line in turn in accordance with the synchronization signal. A line data reading unit reads each line of the image data from a line memory among the line memories while selecting the line memory line by line in turn in accordance with the synchronization signal. If the pulse period of the synchronization signal is not in the predetermined fluctuation range, an error detecting unit discards the image data written into the line memory in this pulse period.

3 Claims, 4 Drawing Sheets (51) Int. Cl.
 *H04N 1/21* (2006.01)
 *H03K 5/1252* (2006.01)

(56) References Cited

U.S. PATENT DOCUMENTS

| | | | |
|---|---|---|---|
| 2008/0143814 A1* | 6/2008 | Masui | G02B 26/127 |
| | | | 347/249 |
| 2011/0164273 A1* | 7/2011 | Masui | G03G 15/043 |
| | | | 358/1.14 |

* cited by examiner

IMAGE PROCESSING APPARATUS WITH AN IMPROVED IMAGE DISTORTION CONTROL

CROSS-REFERENCE TO RELATED APPLICATIONS

This application relates to and claims priority rights from Japanese Patent Application No. 2017-248467, filed on Dec. 25, 2017, the entire disclosures of which are hereby incorporated by reference herein.

BACKGROUND

1. Field of the Present Disclosure

The present disclosure relates to an image processing apparatus.

2. Description of the Related Art

When receiving image data using high speed serial communication in an image processing apparatus, for example, a receiver side writes pixel data of one line into a line memory pixel by pixel in accordance with an external clock, generates a synchronization signal inside of the receiver side, and in accordance with the synchronization signal, repeatedly changes among two line memories a line memory into which the image data is written.

In the aforementioned image processing apparatus, when improper synchronization timing is detected due to a noise, the synchronization of the whole of subsequent image data may be disturbed, and consequently the whole subsequent image may be distorted. Therefore, when detecting that a pulse period (cyclic period) of an external synchronization signal (such as the external clock) and a pulse period of an internal synchronization signal (such as the synchronization signal generated internally) are not identical to each other, another image processing apparatus discards image data written into a line memory in this pulse period and thereby restrains distortion of subsequent image data.

In such electronic apparatuses, a spread spectrum clock generator (SSCG) is sometimes used for EMI (Electro Magnetic Interference) countermeasure.

However, when image data is transmitted in synchronization based on a clock generated by a spread spectrum clock generator (SSCG), the pulse period is fluctuated, and therefore, the aforementioned method that compares the pulse periods of the external and internal synchronization signals is hardly applied.

SUMMARY

An image processing apparatus according to an aspect of the present disclosure includes a receiver circuit, a data reception processing unit, a line data reading unit, and an error detecting unit. The receiver circuit is configured to receive a transmission signal using serial communication, the transmission signal including (a) image data and (b) a synchronization signal that has a pulse period fluctuated in a predetermined fluctuation range. The data reception processing unit is configured to (a) extract the image data and the synchronization signal from the received transmission signal, and (b) write each line of the image data into a line memory among line memories while selecting the line memory line by line in turn in accordance with the synchronization signal. The line data reading unit is configured to read each line of the image data from a line memory among the line memories while selecting the line memory line by line in turn in accordance with the synchronization signal. The error detecting unit is configured to determine whether a pulse period of the synchronization signal is in the predetermined fluctuation range or not, and if the pulse period of the synchronization signal is not in the predetermined fluctuation range, discard the image data written into the line memory in this pulse period.

These and other objects, features and advantages of the present disclosure will become more apparent upon reading of the following detailed description along with the accompanied drawings.

DETAILED DESCRIPTION

Hereinafter, an embodiment according to an aspect of the present disclosure will be explained with reference to drawings.

Figure 1:
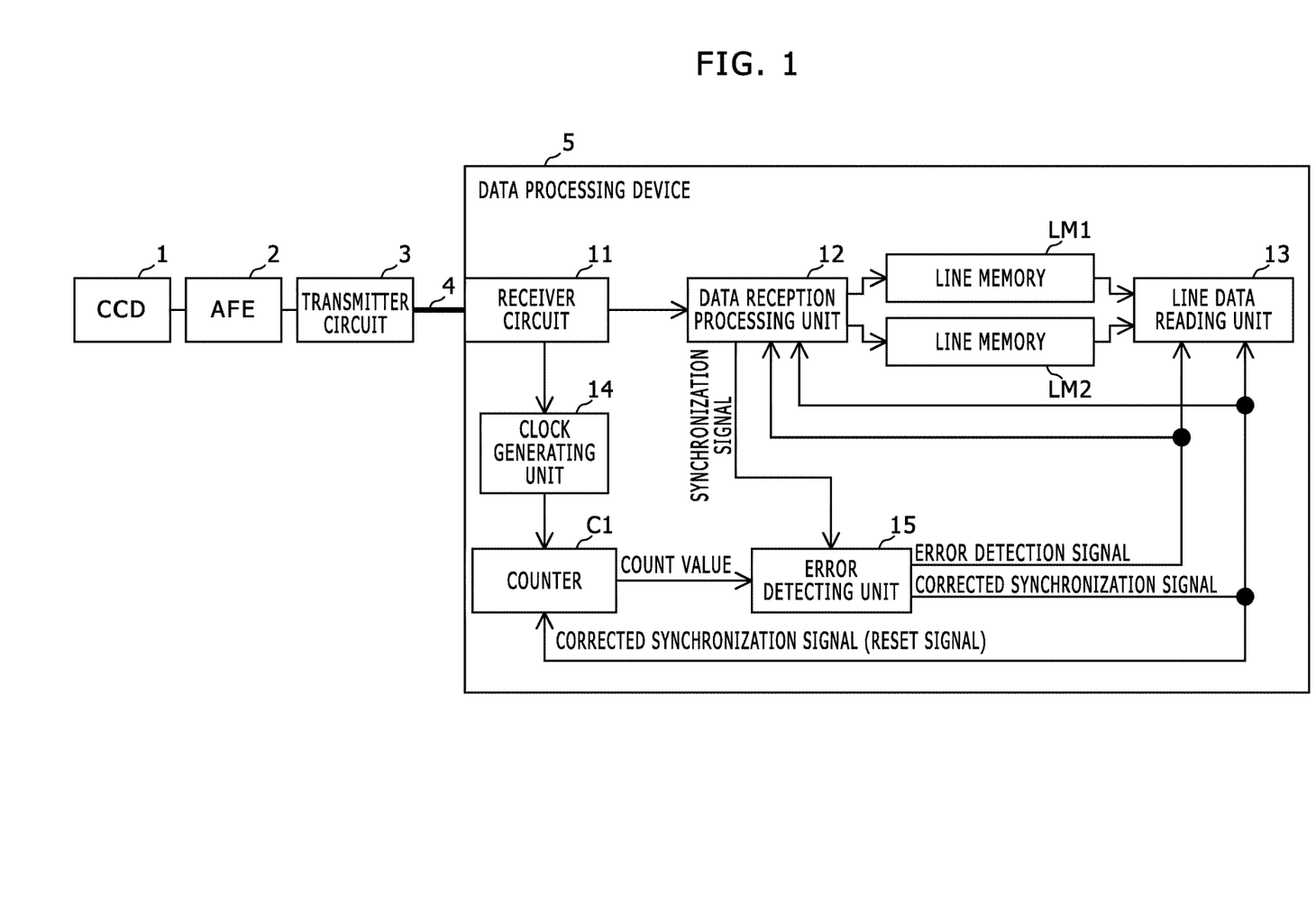
FIG. 1 shows a block diagram that indicates a configuration of an image processing apparatus according to an embodiment of the present disclosure.

FIG. 1 shows a block diagram that indicates a configuration of an image processing apparatus according to an embodiment of the present disclosure. For example, the image processing apparatus shown in FIG. 1 is an image scanning apparatus that optically scans a document image line by line and generates and outputs image data of the document image.

The image processing apparatus includes a CCD (Charge Coupled Device) 1, an analog front end (AFE) 2, a transmitter circuit 3, a serial transmission path 4, and a data processing device 5.

The CCD 1 is an image sensor element that optically reads a document image or the like, for example, and outputs an analog signal corresponding to the image. Another type of an image sensor element may be used instead of the CCD 1. The AFE 2 is a circuit that performs sampling, A/D (Analog to Digital) conversion and the like for the analog signal outputted from the CCD 1, and thereby outputs a digital signal corresponding to the analog signal.

The transmitter circuit 3 is a circuit that outputs to the serial transmission path 4 such as twist pair cable for transmission a transmission signal obtained from the digital signal in accordance with a predetermined serial communication manner. The transmitter circuit 3 includes a serializer.

The transmission signal includes image data and a synchronization signal, and the transmitter circuit 3 transmits the transmission signal in accordance with serial communication. This synchronization signal includes a synchronization pulse, and is a signal for splitting the image data into lines with the synchronization pulse. For example, when a spread spectrum clock generator (SSCG) generates the aforementioned synchronization pulse, a pulse period of the synchronization signal fluctuates within a predetermined fluctuation range.

Specifically, when a lowermost value of the aforementioned predetermined fluctuation range is expressed as T_MIN, and a width of the aforementioned predetermined fluctuation range is expressed as T_WD, a pulse period Ti of the synchronization signal for the i th line is limited as the following expression.

$$T\_MIN \leq Ti < T\_MIN + T\_WD$$

It should be noted that a time interval between the synchronization pulse and the top of the image data (image data of one line) subsequent to this synchronization pulse is constant even when the pulse period fluctuates.

The data processing device 5 is connected through the serial transmission path 4 to the transmitter circuit 3, receives the transmission signal transmitted by the transmitter circuit 3, and output line by line image data obtained from the transmission signal.

The data processing device 5 includes a receiver circuit 11, a data reception processing unit 12, a line data reading unit 13, a clock generating unit 14, an error detecting unit 15, line memories LM1 and LM2, and a counter C1.

The receiver circuit 11 receives the aforementioned transmission signal in accordance with serial communication. In this embodiment, the receiver circuit 11 includes a deserializer.

Due to the transmitter circuit 3, the synchronization signal included in the transmission signal includes a synchronization pulse with a pulse period within the aforementioned fluctuation range. However, on the serial transmission path 4, a noise pulse may be added (as an improper synchronization pulse) in the synchronization signal at different timing from the synchronization pulse, and a synchronization pulse may disappear due to a noise pulse.

The data reception processing unit 12 (a) extracts the image data and the synchronization signal (i.e. an external synchronization signal) from the received transmission signal, and (b) writes each line of the image data into a line memory LM1 or LM2 among line memories LM1 and LM2 while selecting the line memory LM1 or LM2 line by line in turn in accordance with the synchronization signal (i.e. a synchronization pulse) (here, while alternately selecting one or the other of the line memories LM1 and LM2).

The line data reading unit 13 reads each line of the image data from a line memory LM1 or LM2 among the line memories LM1 and LM2 while selecting the line memory LM1 or LM2 line by line in turn in accordance with the synchronization signal (i.e. a synchronization pulse). Specifically, the line data reading unit 13 reads the image data of one line in accordance with the synchronization signal from the line memory LM1 or LM2 to which the data reception processing unit 12 currently does not write the image data.

The clock generating unit 14 generates from the received transmission signal a clock (i.e. clock signal) that has a fixed frequency.

The error detecting unit 15 determines whether a pulse period of the synchronization signal is in the predetermined fluctuation range or not, and if the pulse period of the synchronization signal is not in the predetermined fluctuation range, discards the image data written into the line memory LM1 or LM2 in this pulse period.

Further, the error detecting unit 15 (a) generates a corrected synchronization signal that includes a pulse in synchronization with a synchronization pulse that falls within the predetermined fluctuation range of the synchronization signal, (b) does not form a pulse in the corrected synchronization signal in synchronization with a synchronization pulse that has a pulse period shorter than the predetermined fluctuation range of the synchronization signal, and (c) if the synchronization pulse does not appear until an uppermost value of the predetermined fluctuation range of the synchronization signal, forms a pulse in the corrected synchronization signal at timing of the uppermost value.

Subsequently, the data reception processing unit 12 writes each line of the image data into the line memory LM1 or LM2 while selecting the line memory LM1 or LM2 line by line in turn in accordance with the corrected synchronization signal (i.e. in accordance with the pulse in the corrected synchronization signal). The line data reading unit 13 reads each line of the image data from the line memory LM1 or LM2 while selecting the line memory LM1 or LM2 line by line in turn in accordance with the corrected synchronization signal (i.e. in accordance with the pulse in the corrected synchronization signal).

Consequently, even if a synchronization pulse disappears or an improper synchronization pulse is added in the (external) synchronization signal, writing/reading the image data to/from the line memory LM1 or LM2 is performed at proper timing in accordance with the corrected synchronization signal.

The line memories LM1 and LM2 are memory units of which each has a memory area for storing image data of at least one line.

The counter C1 is a circuit that counts up with the clock generated by the clock generating unit 14.

The error detecting unit 15 determines a length of the pulse period and the like on the basis of a count value of the counter C1, and detects an error on the synchronization signal due to a noise or the like on the basis of the pulse period or the like.

Specifically, when a period of the clock is expressed as Tc, a count value Ni of the i th line under a proper pulse period is substantially Ti/Tc, and when no errors appear in the synchronization signal, the count value Ni is limited as the following expression.

$$HCYCL\_MIN \leq Ni < HCYCL\_MIN + HCYCL\_WD$$

Here, HCYCL_MIN is a count value corresponding to the aforementioned T_MIN (i.e. a lowermost value of the predetermined fluctuation range), and HCYCL_MIN+HCYCL_WD is a count value corresponding to the aforementioned T_MIN+T_WD (i.e. an uppermost value of the fluctuation range).

Specifically, the error detecting unit 15 (a) determines a count value of the counter C1 at detection timing of a synchronization pulse in the aforementioned synchronization signal, (b) if the count value is any value within a range (i.e. from HCYCLE_MIN to HCYCLE_MIN+HCYCLE_WD) corresponding to the aforementioned predetermined fluctuation range, resets the counter C1, (c) if the count value is smaller than the range (i.e. smaller than its lowermost value HCYCLE_MIN) corresponding to the predetermined fluctuation range, does not reset the counter C1 and discards the image data written into the line memory LM1 or LM2 in this pulse period, and (d) if the synchronization pulse is not detected in the synchronization signal until the count value reaches an uppermost value of the range corresponding to the predetermined fluctuation range, resets the counter C1 and discards the image data written into the line memory LM1 or LM2 in this pulse period.

In this embodiment, the error detecting unit 15 provides a reset signal to the counter C1 and thereby resets the counter C1 at timing of a reset pulse in the reset signal. Specifically, (a) if the count value at detection timing of the synchronization pulse is any value within the range corresponding to the predetermined fluctuation range, then the reset pulse is formed in the reset signal in synchronization with the synchronization pulse; (b) if the count value at detection timing of the synchronization pulse is smaller than the range (i.e. smaller than its lowermost value HCYCLE_MIN) corresponding to the predetermined fluctuation range, then the reset pulse is not formed in the reset signal in synchronization with the synchronization pulse; and (c) if the synchronization pulse is not detected in the synchronization signal until the count value reaches an uppermost value (i.e. HCYCLE_MIN+HCYCLE_WD) of the range corresponding to the predetermined fluctuation range, the reset pulse is formed in the reset signal at timing corresponding to the uppermost value.

In this embodiment, the corrected synchronization signal is used as the reset signal.

In this embodiment, for example, the data processing device 5 is embodied with an ASIC (Application Specific Integrated Circuit).

The following part explains a behavior of the aforementioned image processing apparatus.

Figure 2:
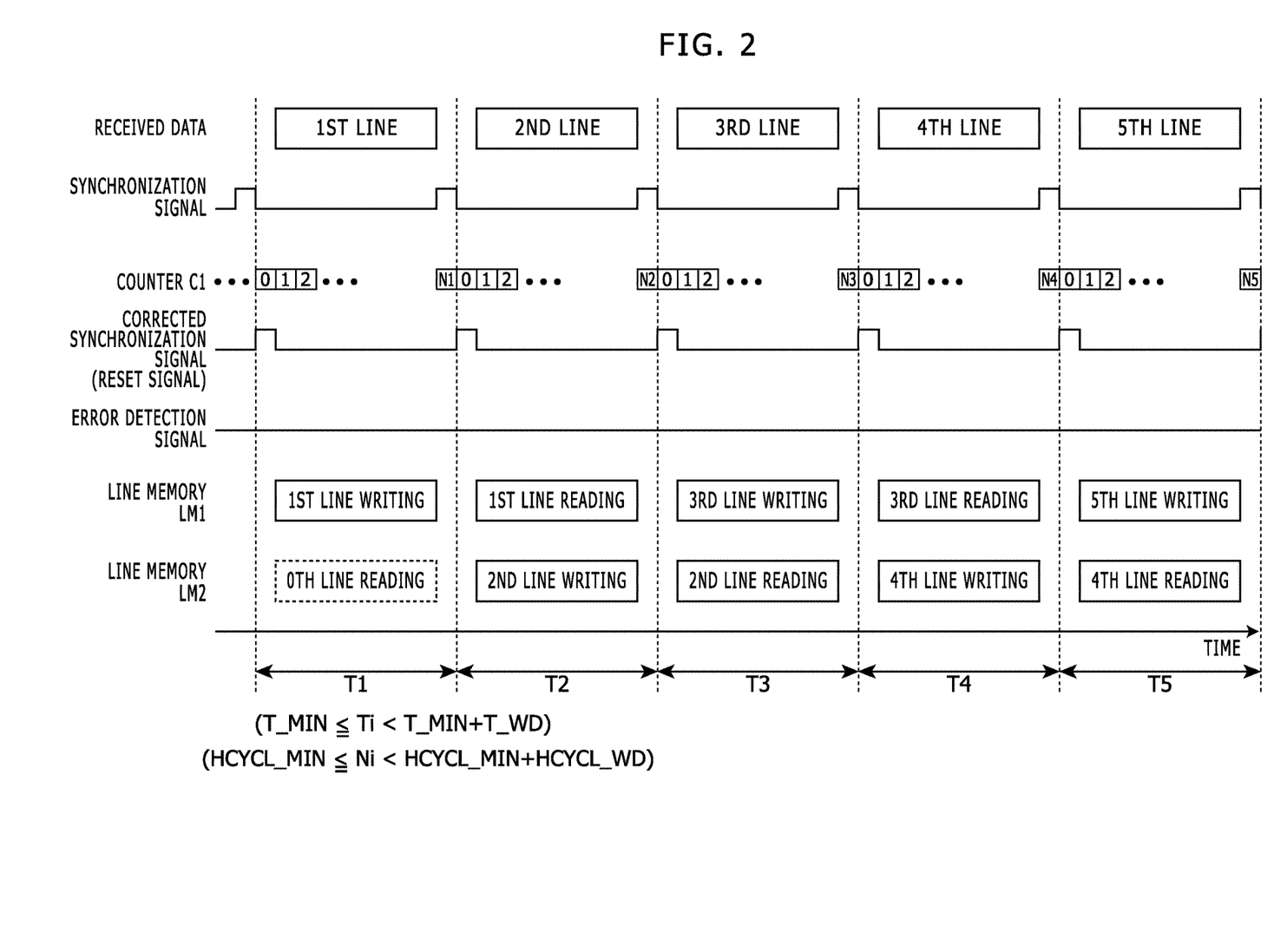
FIG. 2 shows a timing chart that explains a behavior of the image processing apparatus shown in FIG. 1 when no errors appear in a synchronization signal.

FIG. 2 shows a timing chart that explains a behavior of the image processing apparatus shown in FIG. 1 when no errors appear in the synchronization signal.

In this image processing apparatus, as shown in FIG. 2, the receiver circuit 11 receives the transmission signal, the data reception processing unit 12 writes image data obtained from the transmission signal alternatively into the line memory LM1 or LM2 in turn, and the line data reading unit 13 reads and outputs the image data alternatively from the line memory LM1 or LM2 line by line.

Meanwhile, the clock generating unit 14 generates a clock, and the counter C1 counts up in synchronization with the clock in order to measure an elapsed time from the synchronization pulse, and is reset every period of the corrected synchronization signal (i.e. as the reset signal).

If no errors appear in the synchronization signal, then as shown in FIG. 2, a pulse is formed in the corrected synchronization signal so as to synchronize the formed pulse with the synchronization pulse in the synchronization signal, and does not assert an error detection signal, and thereby the data reception processing unit 12 and the line data reading unit 13 perform writing/reading of the image data alternately to/from the line memory LM1 or LM2 line by line.

Contrarily, if an error appears in the synchronization signal, then the error detecting unit 15 detects the error on the basis of a pulse period of the synchronization signal in the following manner, and temporarily stops changing the selection of the line memory LM1 or LM2 and thereby discards the image data of the line in which the error appears.

Figure 3:
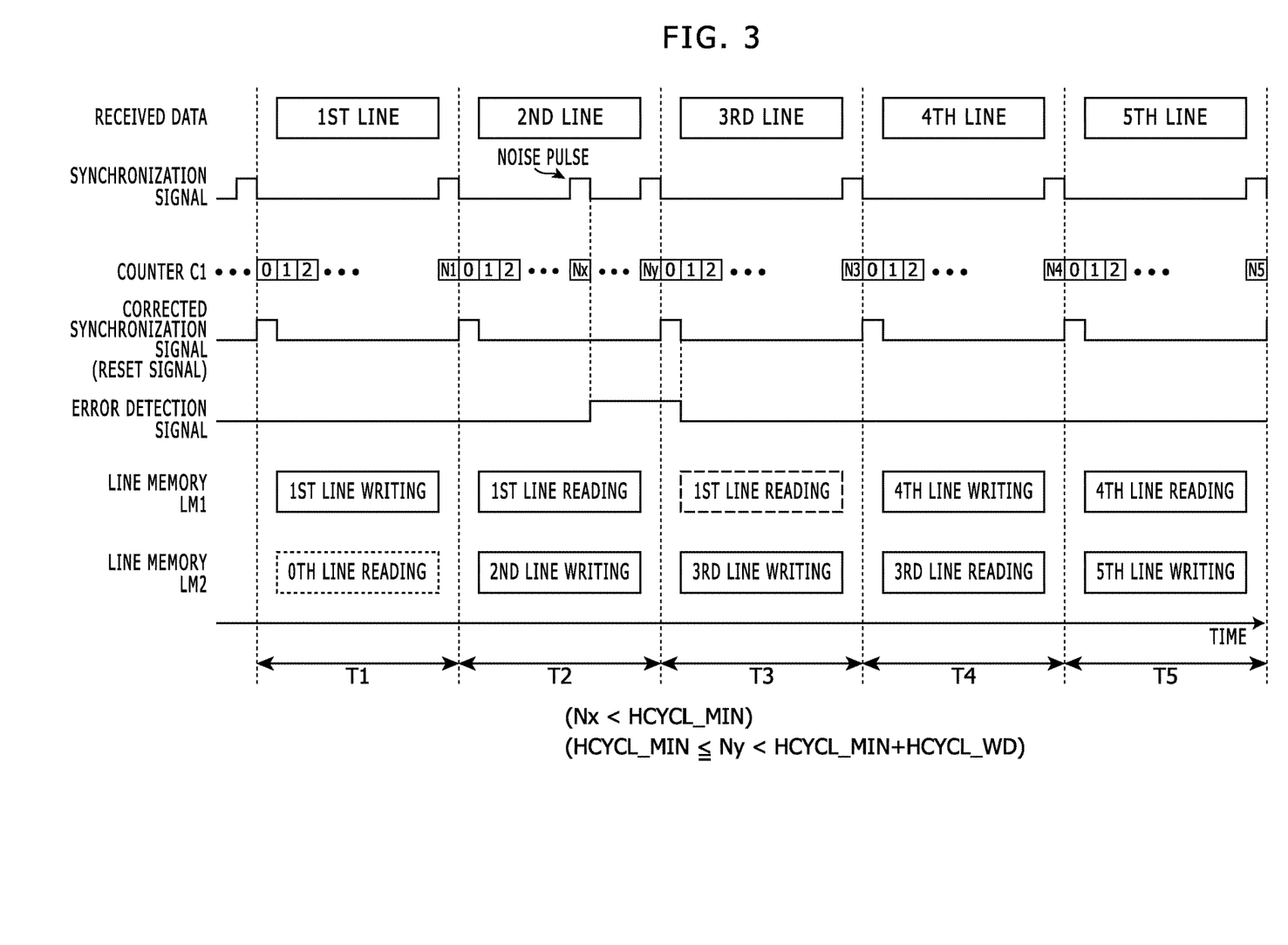
FIG. 3 shows a timing chart that explains a behavior of the image processing apparatus shown in FIG. 1 when an improper synchronization pulse appears in a synchronization signal.
Figure 4:
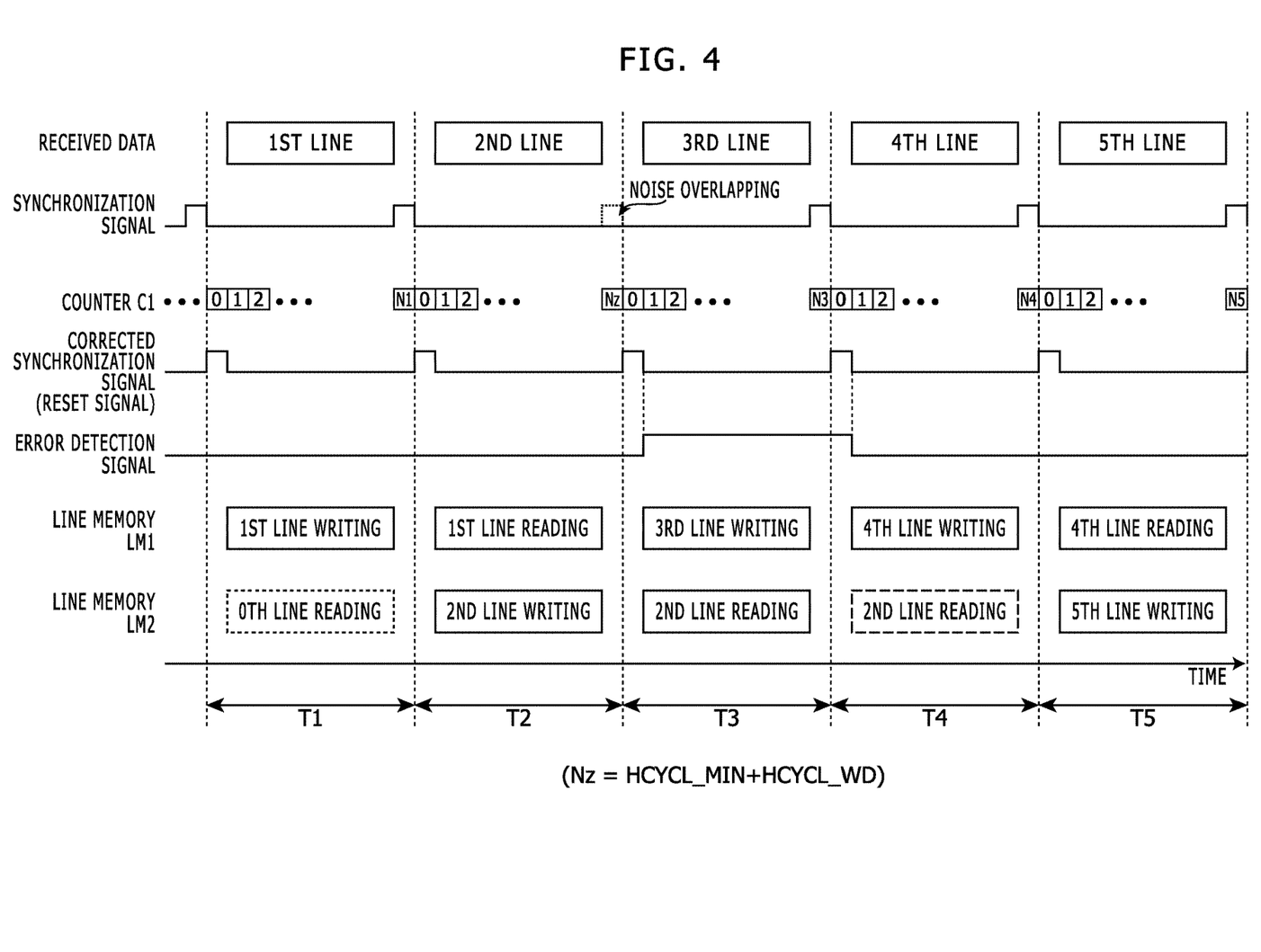
FIG. 4 shows a timing chart that explains a behavior of the image processing apparatus shown in FIG. 1 when a synchronization pulse disappears in a synchronization signal.

FIG. 3 shows a timing chart that explains a behavior of the image processing apparatus shown in FIG. 1 when an improper synchronization pulse appears in the synchronization signal. FIG. 4 shows a timing chart that explains a behavior of the image processing apparatus shown in FIG. 1 when a synchronization pulse disappears in the synchronization signal. It should be noted that in FIGS. 2 to 4, "received data" means image data of each line obtained by the data reception processing unit 12.

In addition, reading the image data from the line memory LM1 or LM2 is performed in accordance with the aforementioned corrected synchronization signal, and therefore, in the image data read from the line memories LM1 and LM2, the error in the synchronization signal does not result in increasing or decreasing lines.

At each clock (i.e. each clock pulse) in the clock generated by the clock generating unit 14, the error detecting unit 15 obtains a current count value of the counter C1, and determines whether a synchronization pulse is detected in the synchronization signal or not.

If the synchronization pulse is not detected and the count value does not reach the aforementioned uppermost value, then the error detecting unit 15 does not take any actions. Therefore, statuses of the corrected synchronization signal and the error detection signal are maintained as they are.

Contrarily, if the synchronization pulse is detected, then the error detecting unit 15 determines whether the count value is any value within the aforementioned predetermined range or not.

If it is determined that the count value is any value within the aforementioned range (i.e. if the synchronization pulse is proper), then as shown in FIG. 2, the error detecting unit 15 forms a pulse in the corrected synchronization signal at the next clock (i.e. at the next clock pulse), and the data reception processing unit 12 and the line data reading unit 13 act in accordance with the pulse in the corrected synchronization signal.

At timing of the pulse in the corrected synchronization signal, as shown in FIG. 2, if the error detection signal is not asserted, then the data reception processing unit 12 and the line data reading unit 13 perform writing/reading the line data (i.e. the image data of a line) with changing the selection of the line memory LM1 or LM2.

Contrarily, at the timing of the pulse in the corrected synchronization signal, as the third line shown in FIG. 3 or the fourth line shown in FIG. 4, if the error detection signal is asserted, then the data reception processing unit 12 and the line data reading unit 13 perform writing/reading the line data (i.e. the image data of a line) without changing the selection of the line memory LM1 or LM2. Subsequently, the error detection signal is negated in synchronization with a pulse in the corrected synchronization signal.

Further, if the count value of the counter C1 is not any value within the aforementioned predetermined range (i.e. if it is determined that the count value is smaller than the aforementioned range, that means addition of an improper synchronization pulse), then as shown in FIG. 3, the error detecting unit 15 does not form in the corrected synchronization signal a pulse corresponding to this (improper) synchronization pulse and asserts the error detection signal. At this time point, a pulse of the corrected synchronization signal is not provided to the data reception processing unit 12 and the line data reading unit 13, and therefore, the data reception processing unit 12 and the line data reading unit 13 do not take improper actions due to this improper synchronization pulse. In this case, the error detection signal is in an assertion status until the next pulse in the corrected synchronization signal, and therefore, in accordance with the next pulse in the corrected synchronization signal, the data reception processing unit 12 and the line data reading unit 13 performs writing/reading the line data without changing the selection of the line memory LM1 or LM2.

Furthermore, if no synchronization pulses are not detected and the count value reaches the aforementioned uppermost value, then as shown in FIG. 4, the error detecting unit 15 forms a pulse in the corrected synchronization signal and asserts the error detection signal. In this case, the error detection signal gets in an assertion status at timing of the next pulse in the corrected synchronization signal, and therefore, in accordance with the next pulse in the corrected synchronization signal, the data reception processing unit and the line data reading unit 13 performs writing/reading the line data without changing the selection of the line memory LM1 or LM2. Specifically, in this case, a synchronization pulse disappears and therefore validity of the image data of a line corresponding to this synchronization pulse (i.e. the third line in FIG. 4, for example) is not ensured, and consequently, the image data of this line (e.g. the third line in FIG. 4) is overwritten with the image data of the next line (e.g. the fourth line in FIG. 4).

As mentioned, in the aforementioned embodiment, using serial communication, the receiver circuit 11 receives a transmission signal that includes (a) image data and (b) a synchronization signal that has a pulse period fluctuated in a predetermined fluctuation range; and the data reception processing unit 12 (a) extracts the image data and the synchronization signal from the received transmission signal, and (b) writes each line of the image data into a line memory LM1 or LM2 among line memories LM1 and LM2 while selecting the line memory LM1 or LM2 line by line in turn in accordance with the synchronization signal. The line data reading unit 13 reads each line of the image data from a line memory LM1 or LM2 among the line memories LM1 and LM2 while selecting the line memory LM1 or LM2 line by line in turn in accordance with the synchronization signal. The error detecting unit 15 determines whether a pulse period of the synchronization signal is in the predetermined fluctuation range or not, and if the pulse period of the synchronization signal is not in the predetermined fluctuation range, discards the image data written into the line memory LM1 or LM2 in this pulse period.

Consequently, even when a synchronization signal generated by a spread spectrum clock generator (SSCG) is used for transmission of image data, the distortion of subsequent image data is restrained if an error appears in the synchronization signal due to a noise or the like.

It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

What is claimed is:

1. An image processing apparatus, comprising:
    a receiver circuit configured to receive a transmission signal using serial communication, the transmission signal including (a) image data and (b) a synchronization signal that has a pulse period fluctuated in a predetermined fluctuation range;
    a data reception processing circuit configured to (a) extract the image data and the synchronization signal from the received transmission signal, and (b) write each line of the image data into a line memory among line memories while selecting the line memory line by line in turn in accordance with the synchronization signal;
    a line data reading circuit configured to read each line of the image data from a line memory among the line memories while selecting the line memory line by line in turn in accordance with the synchronization signal;
    an error detecting circuit configured to determine whether a pulse period of the synchronization signal is in the predetermined fluctuation range or not, and if the pulse period of the synchronization signal is not in the predetermined fluctuation range, discard the image data written into the line memory in this pulse period;
    a clock generating circuit configured to generate a clock from the transmission signal; and
    a counter configured to count up with the clock;
    wherein the error detecting circuit (a) determines a count value of the counter at detection timing of a synchronization pulse in the synchronization signal, (b) if the count value is any value within a range corresponding to the predetermined fluctuation range, resets the counter, (c) if the count value is smaller than the range corresponding to the predetermined fluctuation range, does not reset the counter and discards the image data written into the line memory in this pulse period, and (d) if the synchronization pulse is not detected in the synchronization signal until the count value reaches an uppermost value of the range corresponding to the predetermined fluctuation range, resets the counter and discards the image data written into the line memory in this pulse period.

2. The image processing apparatus according to claim 1, wherein the error detecting circuit provides a reset signal to the counter and thereby resets the counter at timing of a reset pulse in the reset signal;
    (a) if the count value at detection timing of the synchronization pulse is any value within the range corresponding to the predetermined fluctuation range, then the reset pulse is formed in the reset signal in synchronization with the synchronization pulse;
    (b) if the count value at detection timing of the synchronization pulse is smaller than the range corresponding to the predetermined fluctuation range, then the reset pulse is not formed in the reset signal in synchronization with the synchronization pulse; and
    (c) if the synchronization pulse is not detected in the synchronization signal until the count value reaches an uppermost value of the range corresponding to the predetermined fluctuation range, the reset pulse is formed in the reset signal at timing corresponding to the uppermost value.

3. An image processing apparatus, comprising:
    a receiver circuit configured to receive a transmission signal using serial communication, the transmission signal including (a) image data and (b) a synchronization signal that has a pulse period fluctuated in a predetermined fluctuation range;
    a data reception processing circuit configured to (a) extract the image data and the synchronization signal from the received transmission signal, and (b) write each line of the image data into a line memory among line memories while selecting the line memory line by line in turn in accordance with the synchronization signal;
    a line data reading circuit configured to read each line of the image data from a line memory among the line memories while selecting the line memory line by line in turn in accordance with the synchronization signal;
    an error detecting circuit configured to determine whether a pulse period of the synchronization signal is in the predetermined fluctuation range or not, and if the pulse period of the synchronization signal is not in the predetermined fluctuation range, discard the image data written into the line memory in this pulse period;
    wherein the error detecting circuit (a) generates a corrected synchronization signal that includes a pulse in synchronization with a synchronization pulse that falls within the predetermined fluctuation range of the synchronization signal, (b) does not form a pulse in the corrected synchronization signal in synchronization with a synchronization pulse that has a pulse period shorter than the predetermined fluctuation range of the synchronization signal, and (c) if the synchronization pulse does not appear until an uppermost value of the predetermined fluctuation range of the synchronization signal, forms a pulse in the corrected synchronization signal at timing of the uppermost value;

the data reception processing circuit writes each line of the image data into the line memory while selecting the line memory line by line in turn in accordance with the corrected synchronization signal; and     the line data reading circuit reads each line of the image data from the line memory while selecting the line memory line by line in turn in accordance with the corrected synchronization signal.

\* \* \* \* \*